(12) United States Patent
Takahashi

(10) Patent No.: US 11,264,375 B2
(45) Date of Patent: Mar. 1, 2022

(54) SEMICONDUCTOR DEVICE

(71) Applicant: Rohm Co., Ltd., Kyoto (JP)

(72) Inventor: Naoki Takahashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/787,643

(22) Filed: Feb. 11, 2020

(65) Prior Publication Data

US 2020/0258880 A1 Aug. 13, 2020

(30) Foreign Application Priority Data

Feb. 12, 2019 (JP) .............................. JP2019-22920

(51) Int. Cl.
*H01L 27/02* (2006.01)

(52) U.S. Cl.
CPC ........ *H01L 27/0292* (2013.01); *H01L 27/027* (2013.01); *H01L 27/0255* (2013.01)

(58) Field of Classification Search
None
See application file for complete search history.

(56) References Cited

U.S. PATENT DOCUMENTS

| | | | |
|---|---|---|---|
| 10,522,674 B2 * | 12/2019 | Nasu | H01L 29/4238 |
| 2018/0211950 A1 * | 7/2018 | Chiu | H01L 29/0692 |
| 2019/0229151 A1 * | 7/2019 | Matsuzawa | H01L 27/30 |
| 2021/0050340 A1 * | 2/2021 | Abessolo Bidzo | H02H 9/025 |

FOREIGN PATENT DOCUMENTS

JP 2011-9337 1/2011

* cited by examiner

*Primary Examiner* — Steven M Christopher
(74) *Attorney, Agent, or Firm* — Fish & Richardson P.C.

(57) ABSTRACT

A semiconductor device has an N-type substrate, a through conductor penetrating the N-type substrate, a protection target circuit provided on the N-type substrate, and an ESD protection circuit provided on the N-type substrate. The protection target circuit and the ESD protection circuit are connected together to the through conductor.

10 Claims, 9 Drawing Sheets

SEMICONDUCTOR DEVICE

This nonprovisional application claims priority under 35 U.S.C. § 119(a) on Patent Application No. 2019-022920 filed in Japan on Feb. 12, 2019, the entire contents of which are hereby incorporated by reference.

BACKGROUND OF THE INVENTION

Field of the Invention

The present invention relates to a semiconductor device provided with an ESD (electrostatic discharge) protection circuit.

Description of Related Art

ESD protection circuits are used to protect the internal circuits of semiconductor devices from ESD due to extraneous electrostatic charge. One example of conventional technology related to what has just been mentioned is seen in Japanese Unexamined Patent Application Publication No. 2011-9337.

Increasing the reliability of semiconductor devices requires increasing their tolerance to ESD.

SUMMARY OF THE INVENTION

An object of the present invention is to provide a semiconductor device that offers increased tolerance to ESD.

According to one aspect of what is disclosed herein, a semiconductor device includes: an N-type substrate; a through conductor penetrating the N-type substrate; a protection target circuit provided on the N-type substrate; and an ESD protection circuit provided on the N-type substrate. Here, the protection target circuit and the ESD protection circuit are connected together to the through conductor.

According to another aspect of what is disclosed herein, an electronic appliance includes a semiconductor device as described above.

According to yet another aspect of what is disclosed herein, a vehicle includes: a battery; and an electronic appliance as described above configured to operate by being supplied with a supply voltage from the battery.

The significance and effects of the present invention will be further clarified by the description of embodiments below. It should be understood that the following embodiments are merely examples of how the present invention can be implemented, and thus the senses of the terms used to describe the present invention and its constituent elements are not limited in any way to those in which they are used in the following description of embodiments.

DETAILED DESCRIPTION OF PREFERRED EMBODIMENTS

1. Semiconductor Device

Figure 1:
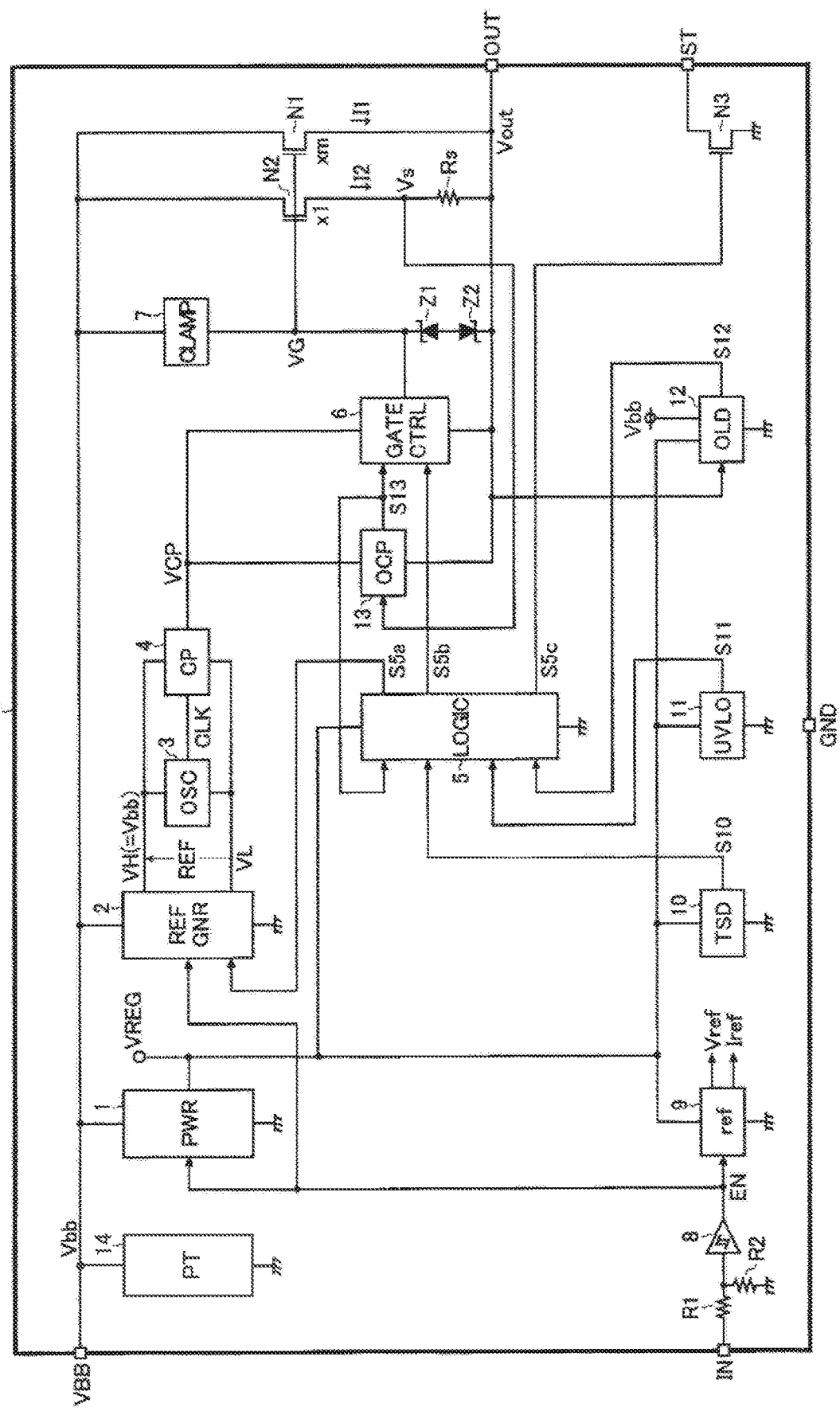
FIG. 1 is a block diagram of one configuration example of a semiconductor device.

FIG. 1 is a block diagram showing one configuration example of a semiconductor device. The semiconductor device 100 of this configuration example is a vehicle-mounted high-side switch IC and has a plurality of external terminals (an IN pin, a GND pin, an OUT pin, a ST pin, and a VBB pin) as means for establishing electrical connection with outside the device. The IN pin is an input terminal for receiving external input of a control signal from a CMOS logic IC or the like. The GND pin is a ground terminal. The OUT pin is an output terminal to which a load (such as an ECU (electronic control unit) for controlling an engine), an air conditioner, or body equipment) is externally connected. The ST pin is an output terminal for external output of a self-diagnosis signal to the CMOS logic IC or the like. The VBB pin is a power terminal for receiving supply of a supply voltage Vbb (for example, 4.5 V to 18 V) from a battery. A plurality of VBB pins may be arranged in parallel with each other (for example, four pins in parallel) to allow passage of a high current.

The semiconductor device 100 of this configuration example is built by integrating together an internal power supply circuit 1, a constant voltage generation circuit 2, an oscillation circuit 3, a charge pump circuit 4, a logic circuit 5, a gate control circuit 6, a clamp circuit 7, an input circuit 8, a reference generation circuit 9, a temperature protection circuit 10, an undervoltage protection circuit 11, an open protection circuit 12, an overcurrent protection circuit 13, an ESD protection circuit 14, N-channel MOS field-effect transistors N1 to N3, resistors R1 and R2, a sense resistor Rs, and Zener diodes Z1 and Z2.

The internal power supply circuit 1 is connected between the VBB pin and the GND pin, and generates from the supply voltage Vbb a predetermined internal supply voltage VREG to supply it to different parts of the semiconductor device 100. Whether or not to operate the internal power supply circuit 1 is controlled in accordance with the logic level of an enable signal EN. More specifically, the internal power supply circuit 1 is in an operating state when the enable signal EN is at a logic level (for example, high level) indicating an enabled state, and is in a halted state when the enable signal EN is at a logic level (for example, low level) indicating a disabled state.

The constant voltage generation circuit 2 is connected between the VBB pin and the GND pin, and generates a high voltage VH (=the supply voltage Vbb) in accordance with the supply voltage Vbb and a low voltage VL (=Vbb−REF) lower than the high voltage VH by a constant voltage REF (for example, 5 V) to feed these voltages to an oscillation circuit 3 and to a charge pump circuit 4. Whether or not to operate the constant voltage generation circuit 2 is controlled in accordance with the logic levels of the enable signal EN and a fault protection signal S5a. More specifically, the constant voltage generation circuit 2 is in an operating state when the enable signal EN is at a logic level (for example, high level) indicating an enabled state or when the fault protection signal S5a is at a logic level (for example, high level) indicating no fault being detected, and is in a halted state when the enable signal EN is at a logic level (for example, low level) indicating a disabled state or when the fault protection signal S5a is at a logic level (for example, low level) indicating a fault being detected.

The oscillation circuit 3 operates by being supplied with the high voltage VH and the low voltage VL, and generates a clock signal of a predetermined frequency to feed it to the charge pump circuit 4. The clock signal CLK is a signal with a square waveform which is pulse-driven between the high voltage VH and the low voltage VL.

The charge pump circuit 4 operates by being supplied with the high voltage VH and the low voltage VL, and by driving a flying capacitor using the clock signal CLK, generates a boosted voltage VCP higher than the supply voltage Vbb to supply the boosted voltage VCP to the gate control circuit 6 and to the overcurrent protection circuit 13.

The logic circuit 5 operates by being supplied with the internal supply voltage VREG, and generates a gate control signal S5b to feed it to the gate control circuit 6. The gate control signal S5 is a binary signal that turns to high level (=VREG) when turning on the transistors N1 and N2 and that turns to low level (=GND) when turning off the transistors N1 and N2. The logic circuit 5 has a function of monitoring each of a temperature protection signal S10, an undervoltage protection signal S11, an open protection signal S12, and an overcurrent protection signal S13 to perform fault protection operation whenever necessary. More specifically, the logic circuit 5, when a fault is detected in the semiconductor device 100, turns the fault protection signal S5a to a logic level indicating a fault being detected to halt the constant voltage generation circuit 2 and in addition turns the gate control signal S5b to low level to forcibly turn off both the transistors N1 and N2. The logic circuit 5 also has a function of generating a gate signal S5c for the transistor N3 in accordance with the result of fault detection.

The gate control circuit 6 is connected between an application point for the boosted voltage VCP and the OUT pin (that is, an application point for the output voltage Vout), and generates a gate voltage VG by increasing the current capacity of the gate control signal S5b to feed the gate voltage VG to the gates of the transistors N1 and N2. The gate voltage VG is at high level (=VCP) when the gate control signal S5b is at high level and is at low level (=Vo) when the gate control signal S5b is at low level. Whether or not to operate the gate control circuit 6 is controlled in accordance with the logic level of the overcurrent protection signal S13. More specifically, the gate control circuit 6 is in an operating state when the overcurrent protection signal S13 is at a logic level (for example, low level) indicating no fault being detected, and is in a halted state when the overcurrent protection signal S13 is at a logic level (for example, high level) indicating a fault being detected.

The clamp circuit 7 is connected between the VBB pin and the gates of both of the transistors N1 and N2. In an application in which an inductive load is connected to the OUT pin, when the transistor N1 is turned from on to off, due to a counter-electromotive force in the inductive load, the OUT pin falls to a negative voltage. To cope with this, a clamp circuit 7 (what is called an active clamp circuit) is provided for absorbing energy. The active clamp voltage given by Vbb−(Vclp+Vgs) can be set at, for example, 48 V (where Vbb is the supply voltage, Vclp is the negative-side clamp voltage at the OUT pin, and Vgs is the gate-source voltage of the transistor N1).

The input circuit 8 is a Schmitt trigger that receives input of a control signal from the IN pin to generate the enable signal EN.

The reference generation circuit 9 operates by being supplied with the internal supply voltage VREG, and generates a predetermined reference voltage Vref and a predetermined reference current Iref to supply them to different parts of the semiconductor device 100. The reference voltage Vref and the reference current Iref are used, for example, for setting a target value for the internal supply voltage VREG in the internal power supply circuit 1 and for setting threshold values for fault detection in the different protection circuits 9 to 13.

The temperature protection circuit 10 operates by being supplied with the internal supply voltage VREG. The temperature protection circuit 10 includes a temperature sensing element (unillustrated) for detecting overheating of the transistor N1, and generates the temperature protection signal S10 in accordance with the result of the detection (that is, whether or not overheating is occurring) to feed the temperature protection signal S10 to the logic circuit 5. The temperature protection signal S10 is a binary signal; for example, it is at low level (=GND) when no fault is being detected and is at high level (=VREG) when a fault is being detected.

The undervoltage protection circuit 11 operates by being supplied with the internal supply voltage VREG, and generates the undervoltage protection signal S11 in accordance with the result of monitoring of the supply voltage Vbb or the internal supply voltage VREG (that is, whether an undervoltage fault is occurring) to feed the undervoltage protection signal Si 1 to the logic circuit 5. The undervoltage protection signal Si 1 is a binary signal; for example, it is at low level (=GND) when no fault is being detected and is at high level (=VREG) when a fault is being detected.

The open protection circuit 12 operates by being supplied with the supply voltage Vbb and the internal supply voltage VREG, and generates the open protection signal S12 in accordance with the result of monitoring of the output voltage Vout (that is, whether an open fault is occurring in the load) to feed the open protection signal S12 to the logic circuit 5. The open protection signal S12 is a binary signal; for example, it is at low level (=GND) when no fault is being detected and is at high level (=VREG) when a fault is being detected.

The overcurrent protection circuit 13 is connected between an application point for the boosted voltage VCP and the OUT pin (that is, the application point for the output voltage Vout), and generates the overcurrent protection signal S13 in accordance with the result of monitoring of the sense voltage Vs (that is, whether an overcurrent is occurring) to feed the overcurrent protection signal S13 to the logic circuit 5. The overcurrent protection signal S13 is a binary signal; for example, it is at low level (=GND) when no fault is being detected and is at high level (=VREG) when a fault is being detected.

The ESD protection circuit 14 protects the internal power supply circuit 1, the constant voltage generation circuit 2, the input circuit 8, the open protection circuit 12, and the like from ESD due to extraneous electrostatic charge. The internal power supply circuit 1, the constant voltage generation circuit 2, the input circuit 8, the open protection circuit 12, and the like are all circuits that are supplied with the supply voltage Vbb and the ground voltage.

The transistor N1 is a power transistor of which the drain is connected to the VBB pin and of which the source is connected to the OUT pin, and functions as a switching element (high-side switch) for switching between conducting and cut-off states the current path through which the output current I1 flows from the battery to the load. The transistor N1 is on when the gate voltage VG is at high level, and is off when the gate voltage VG is at low level.

The lower the on-resistance of the transistor N1 is, the more likely an overcurrent is to occur when a ground fault occurs at the OUT pin (when this pin is short-circuited to a grounded point or a comparable low-potential point), and thus the more likely excessive heat is to be produced. Thus, the lower the on-resistance of the transistor N1 is, the greater is the significance of the temperature protection circuit 10 and the overcurrent protection circuit 13.

The transistor N2 is a mirror transistor connected in parallel with the transistor N1, and generates a mirror current I2 in accordance with the output current I1. The size ratio of the transistor N1 to the transistor N2 is m:1 (where, m>1; for example, m=1000). Thus, the mirror current I2 has 1/m (one mth) the magnitude of the output current I1. Like the transistor N1, the transistor N2 is on when the gate voltage VG is at high level, and is off when the gate voltage VG is at low level.

The transistor N3 is an open-drain transistor of which the drain is connected to the ST pin and of which the source is connected to the GND pin. The transistor N3 is on when the gate signal S5c is at high level, and is off when the gate signal S5c is at low level. That is, the self-diagnosis signal that is externally output from the ST pin is at low level when the gate signal S5c is at high level (that is, when the transistor N3 is on), and is at high level when the gate signal S5c is at low level (when the transistor N3 is off).

The resistor R1 is connected between the IN pin and the input terminal of the input circuit 8, and functions as a current limiting resistor for restraining an excessive surge current and the like.

The resistor R2 is connected between the input terminal of the input circuit 8 and the GND pin, and functions as a pull-down resistor that ensures, when the IN pin is open, that the logic level fed to the input circuit 8 is at low level (a logic level indicating a disabled state).

The sense resistor Rs is connected between the source of the transistor N2 and the OUT pin, and functions as a current sensing element which generates the sense voltage Vs (=I2× Rs) in accordance with the mirror current I2.

The Zener diode Z1 is connected between the gates of the transistors N1 and N2 and the OUT pin with the cathode pointing to the gates of the transistors N1 and N2 and the anode pointing to the OUT pin. So connected, the Zener diode Z1 functions, in a regular connection state where a battery is connected to the VBB pin and a load is connected to the OUT pin, as a clamping element (surge voltage absorbing element) which limits the gate-source voltage of the transistors N1 and N2 to equal to or lower than a predetermined upper limit value.

The Zener diode Z2 is connected between the gates of the transistors N1 and N2 and the OUT pin with the anode pointing to the gates of the transistors N1 and N2 and the cathode pointing to the OUT pin. So connected, the Zener diode Z2 functions, in a reverse connection state where a load is connected to the VBB pin and a battery is connected to the OUT pin, as a reverse connection protection element for cutting off the current path from the OUT pin to the gates of the transistors N1 and N2.

As mentioned above, the semiconductor device 100 is configured as a monolithic power IC which incorporates CMOS logic circuits (such as the logic circuit 5) and a power MOS device (such as the transistor N1) on one chip. This one chip is an N-type substrate SUB1 (see FIGS. 4 to 8 described later) such as, for example, an N-type silicon substrate. The reverse face of the N-type substrate SUB1 (see FIGS. 4 to 8 described later) is electrically connected to the VBB pin. That is, the supply voltage Vbb is applied to the reverse face of the N-type substrate SUB1 (see FIGS. 4 to 8 described later).

2. ESD Protection Circuit

Figure 2:
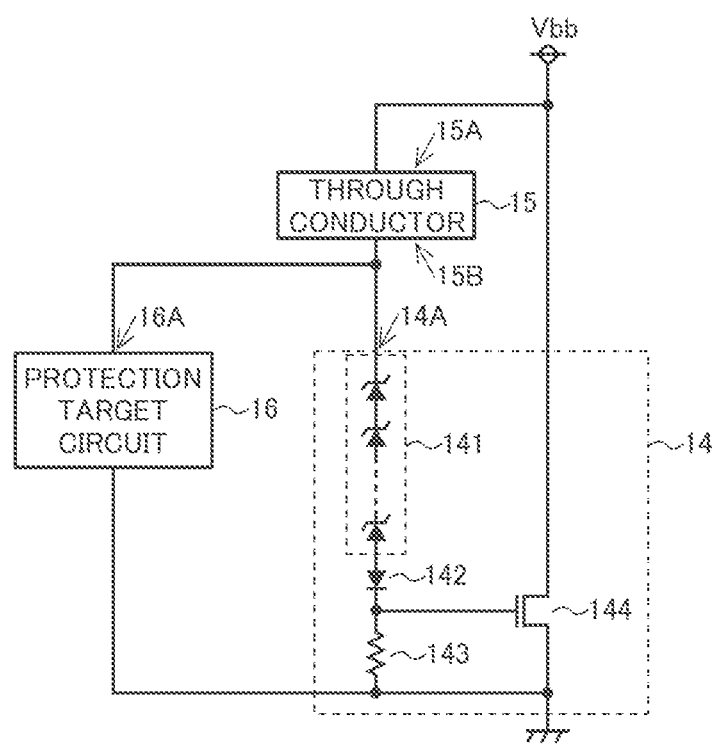
FIG. 2 is a circuit diagram showing one configuration example of an ESD protection circuit.

FIG. 2 is a circuit diagram showing one configuration example of the ESD protection circuit 14. The ESD protection circuit 14 shown in FIG. 2 includes a clamper 141 which is a serial array of a plurality of Zener diodes, a diode 142, a resistor 143, and a VDMOS (vertical double-diffused metal-oxide semiconductor) 144 which is one example of a vertical field-effect transistor.

In the N-type substrate SUB1 (see FIGS. 4 to 8 described below) included in the semiconductor device 100, a through conductor 15 that penetrates the N-type substrate SUB1 (see FIGS. 4 to 8 described later) is formed.

A reverse-side end part 15A of the through conductor 15 is supplied with the supply voltage Vbb. The reverse-side end part 15A of the through conductor 15 is located on the reverse face of the N-type substrate.

To an obverse-side end part 15B of the through conductor 15, the cathode of the clamper 141 and a protection target circuit 16 are connected. More specifically, to the obverse-side end part 15B of the through conductor 15 are connected, via a metal conductor provided on the obverse face of the N-type substrate SUB1 (see FIGS. 4 to 8 described below), the cathode of the clamper 141 and the protection target circuit 16. The obverse-side end part 15B of the through conductor 15 is located on the obverse face of the N-type substrate SUB1 (see FIGS. 4 to 8 described below).

The drain of the VDMOS 144 is formed on the reverse side of the N-type substrate SUB1 (see FIGS. 4 to 8 described below), and the gate and the source of the VDMOS 144 are formed on the obverse side of the N-type substrate SUB1 (see FIGS. 4 to 8 described below).

The anode of the clamper 141 is connected to the gate of the VDMOS 144 and to one end of the resistor 143. The other end of the resistor 143, the source of the VDMOS 144, and the protection target circuit 16 are supplied with the ground voltage.

When the voltage applied to the through conductor 15 is equal to or lower than a threshold voltage, the Zener diodes in the clamper 141 are off, and the resistor 143 pulls down the gate of the VDMOS 144; thus, the VDMOS 144 is off.

On the other hand, when ESD is applied to the VBB pin and the voltage applied to the through conductor 15 exceeds the threshold voltage, the Zener diodes in the clamper 141 are on, and clamper 141 generates a clamp voltage. The clamp voltage equals the sum of the respective Zener voltages of the Zener diodes in the clamper 141. When the clamper 141 is generating the clamp voltage, the Zener current that flows through the clamper 141 flows also through the diode 142 and the resistor 143, and a terminal-to-terminal potential difference across the resistor 143 turns on the VDMOS 144. When the VDMOS 144 is on, it draws a current from the VBB pin. Operating in this way, the ESD protection circuit 14 absorbs an ESD surge and protects the protection target circuit 16 from ESD.

In the ESD protection circuit 14 shown in FIG. 2, the ESD protection circuit 14 and the protection target circuit 16 are connected together to the through conductor 15. This helps restrain a voltage difference between the supply voltage application point 14A of the ESD protection circuit 14 and the supply voltage application point 16A of the protection target circuit 16. It is thus possible to increase ESD tolerance.

In contrast to the ESD protection circuit 14 shown in FIG. 2, in a configuration where a first through conductor that is connected to the supply voltage application point 14A of the ESD protection circuit 14 and a second through conductor that is connected to the supply voltage application point 16A of the protection target circuit 16 are provided separately, separate voltages are supplied from the reverse face of the N-type substrate SUB1 (see FIGS. 4 to 8 described below) to the supply voltage application point 14A of the ESD protection circuit 14 and to the supply voltage application point 16A of the protection target circuit 16. This makes a potential difference more likely to arise between the supply voltage application point 14A of the ESD protection circuit 14 and the supply voltage application point 16A of the protection target circuit 16, and thus makes it impossible to increase ESD tolerance.

Figure 3:
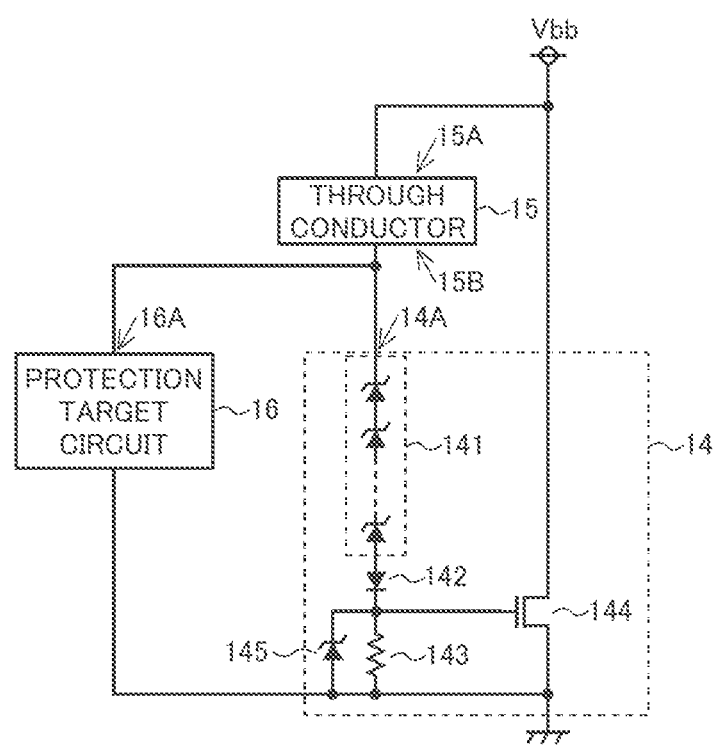
FIG. 3 is a circuit diagram showing another configuration example of an ESD protection circuit.
Figure 4:
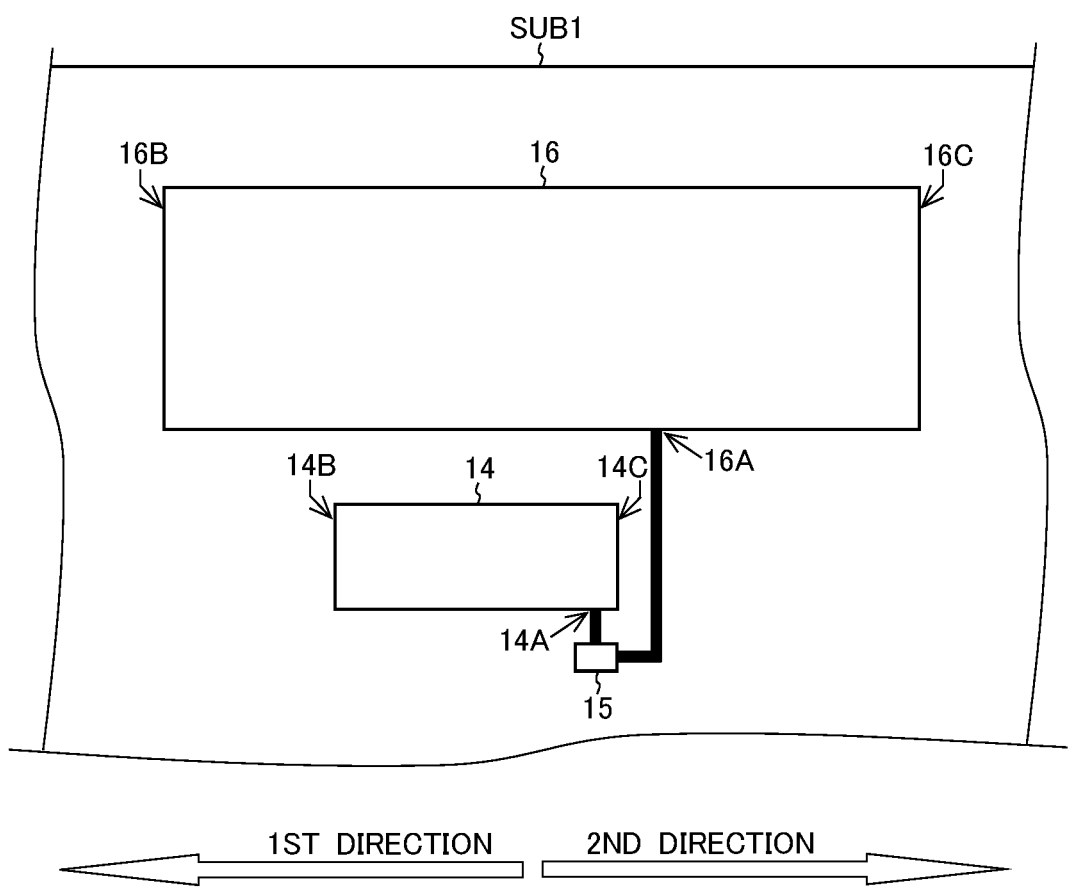
FIG. 4 is a diagram showing a first arrangement example of an ESD protection circuit, a through conductor, and a protection target circuit.
Figure 5:
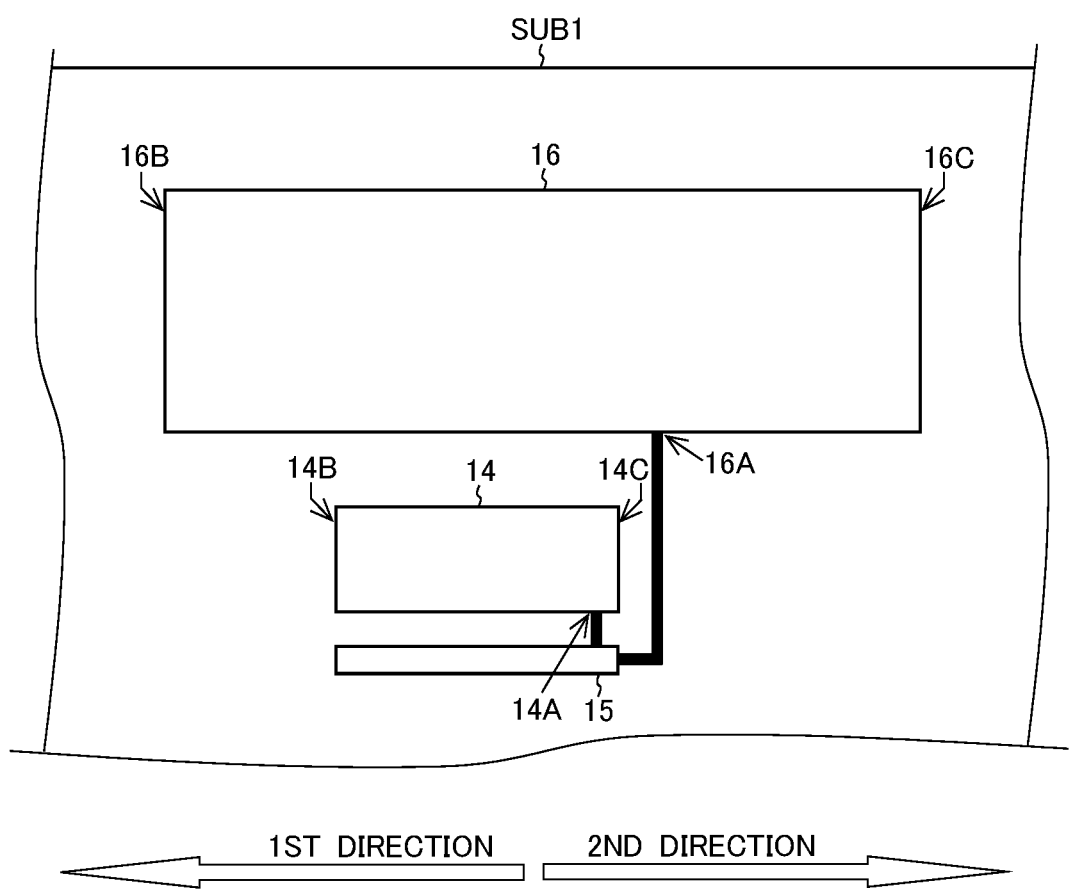
FIG. 5 is a diagram showing a second arrangement example of an ESD protection circuit, a through conductor, and a protection target circuit.
Figure 6:
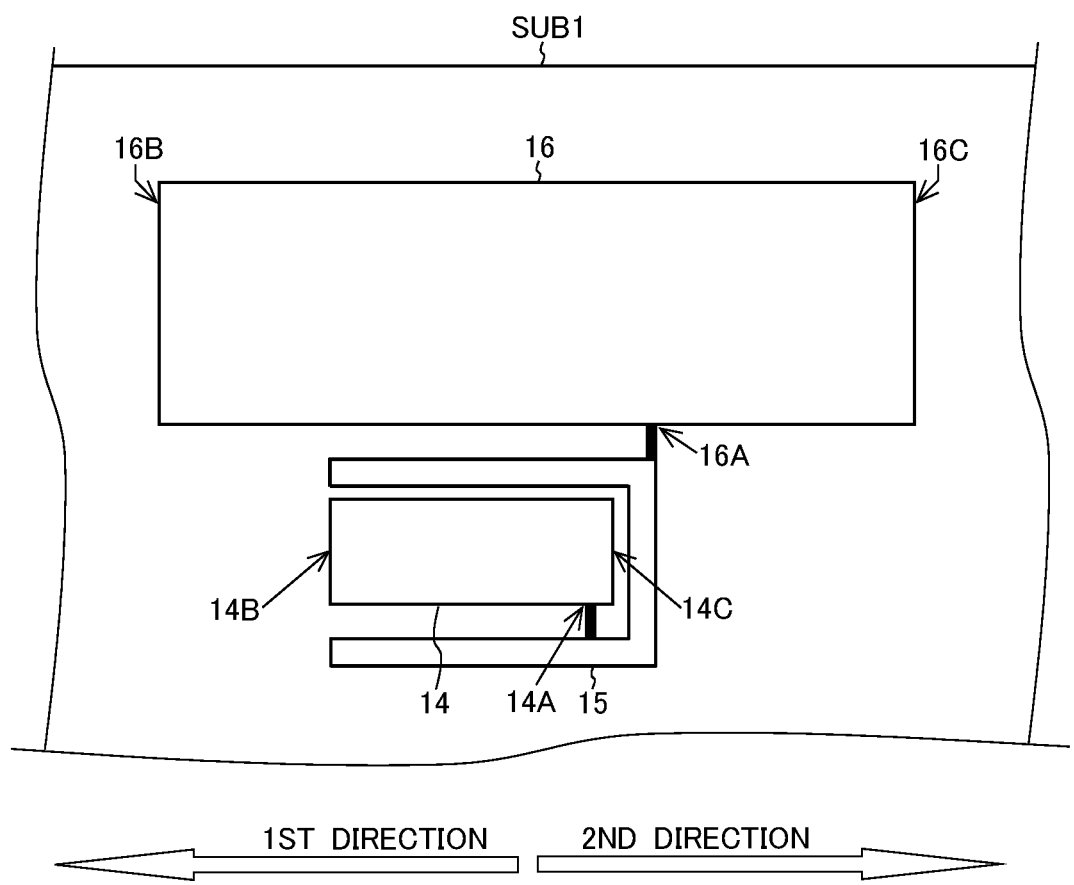
FIG. 6 is a diagram showing a third arrangement example of an ESD protection circuit, a through conductor, and a protection target circuit.

FIG. 3 is a diagram showing another configuration example of the ESD protection circuit 14. The ESD protection circuit 14 shown in FIG. 3, as compared with the ESD protection circuit 14 shown in FIG. 2, additionally includes a clamper 145. The clamper 145 is connected in parallel with the resistor 143. Although FIG. 3 shows, as the clamper 145, one Zener diode, this Zener diode is meant merely as an example; the clamper 145 can be a serial array of a plurality of Zener diodes.

In the ESD protection circuit 14 shown in FIG. 3, when the voltage applied to the through conductor 15 exceeds a threshold voltage, the clamper 145 clamps the gate-source voltage of the VDMOS 144. In this way, the gate-source voltage of the VDMOS 144 can be controlled so as not to exceed the gate-source withstand voltage of the VDMOS 144.

FIGS. 4 to 8 are each a part top view of the N-type substrate SUB1. FIGS. 4 to 8 are diagrams showing a first to a fifth arrangement example, respectively, of the ESD protection circuit 14, the through conductor 15, and the protection target circuit 16. In FIGS. 4 to 8, such parts as find the same parts in FIG. 2 are identified by the same reference signs. In FIGS. 4 to 8, thick lines represent metal conductors such as aluminum conductors.

In the first to fifth arrangement examples shown in FIGS. 4 to 8, as seen in a top view of the N-type substrate SUB1, a first-direction end part 16B of the protection target circuit 16 is located to the first-direction side of a first-direction end part 14B of the ESD protection circuit 14, and a second-direction end part 16C of the protection target circuit 16 is located to the second-direction side of a second-direction end part 14C of the ESD protection circuit 14. As shown in FIGS. 4 to 8, the first and second directions are directions that are opposite to each other. In this way, it is possible to reduce variations among the length of the metal conductor from the through conductor 15 to the internal power supply circuit 1 in the protection target circuit 16, the length of the metal conductor from the through conductor 15 to the constant voltage generation circuit 2 in the protection target circuit 16, the length of the metal conductor from the through conductor 15 to the input circuit 8 in the protection target circuit 16, and the length of the metal conductor from the through conductor 15 to the open protection circuit 12 in the protection target circuit 16. As a measure against ESD, the Vbb-GND voltage (the difference between the supply voltage Vbb and the ground voltage) in the protection target circuit 16 needs to be equal to or lower than the clamp voltage generated by the ESD protection circuit 14 in response to ESD. This is achieved with a design that gives a low impedance to the through conductor 15 and that gives a low impedance to the metal conductor provided between the supply voltage application point 14A of the ESD protection circuit 14 and the through conductor 15. By contrast, considering that the voltage applied to the protection target circuit 16 needs to be low, the higher the impedance of the metal conductor provided between the through conductor 15 and the supply voltage application point 16A of the protection target circuit 16, the higher the voltage drop, and thus the more effective the measure against ESD. Even so, considering the operating characteristics during normal operation (operation under no application of an ESD surge), the lower the impedance there, the better.

In the second to fifth arrangement examples shown in FIGS. 5 to 8, as seen in a top view of the N-type substrate SUB1, the through conductor 15 has an extending part that extends along an outer edge of the ESD protection circuit 14. In the present description, an extending part denotes a part of the through conductor 15 where the length of the through conductor 15 is twice as large as or larger than the maximum width of the through conductor 15. In the present specification, the width of the through conductor 15 denotes the dimension of the through conductor 15 in the direction perpendicular to the direction in which the through conductor 15 extends along an outer edge of the ESD protection circuit 14. Providing the through conductor 15 with an extending part helps reduce the impedance of the through conductor 15 efficiently (while reducing the unused area in the layout).

Figure 7:
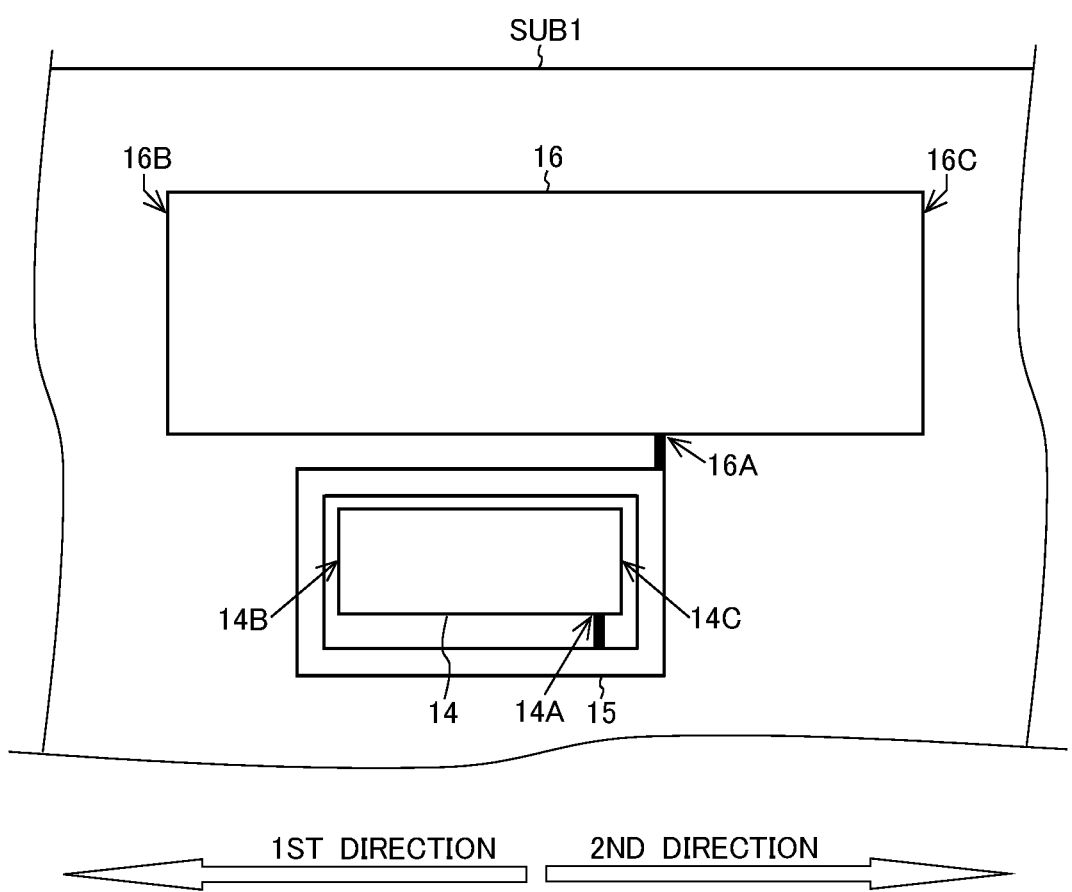
FIG. 7 is a diagram showing a fourth arrangement example of an ESD protection circuit, a through conductor, and a protection target circuit.
Figure 8:
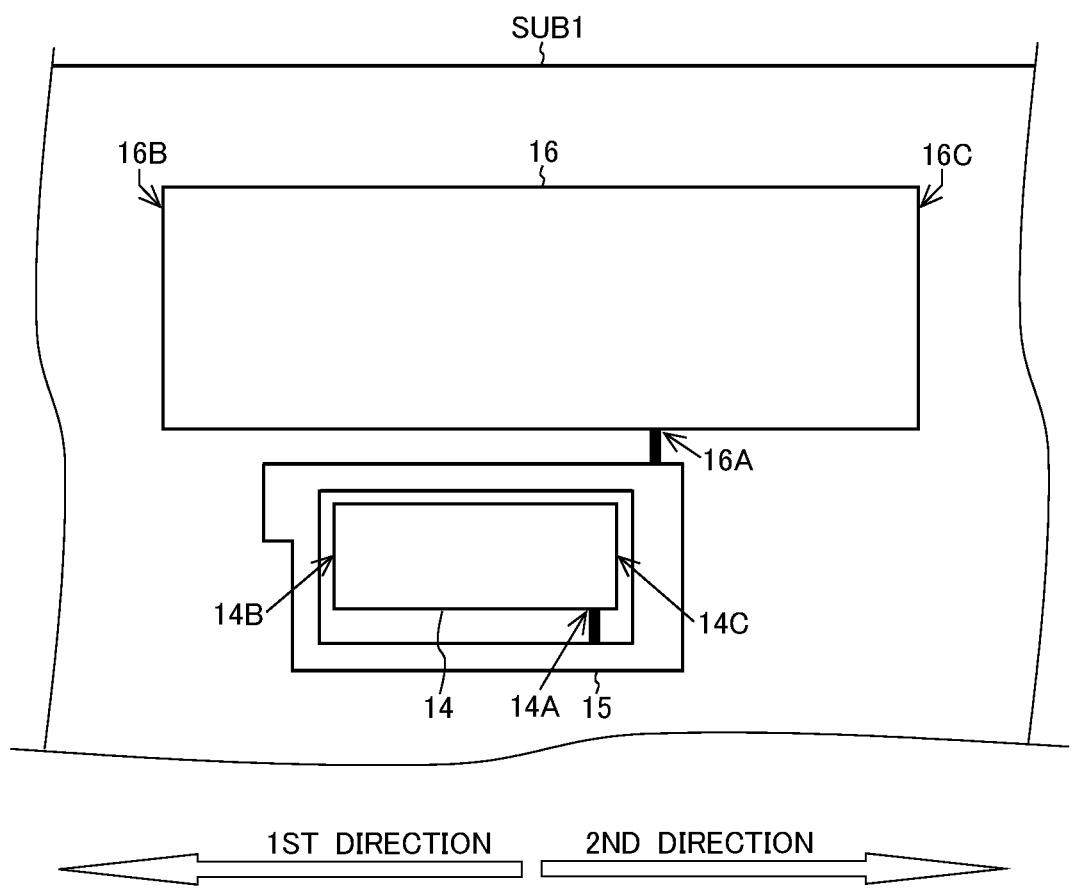
FIG. 8 is a diagram showing a fifth arrangement example of an ESD protection circuit, a through conductor, and a protection target circuit.

In the fourth and fifth arrangement examples shown in FIGS. 7 and 8, as seen in a plan view of the N-type substrate SUB1, the extending part is ring-shaped. This helps reduce the impedance of the through conductor 15 more efficiently.

In the fifth arrangement example shown in FIG. 8, as seen in a plan view of the N-type substrate SUB1, the extending part is given an uneven width. This helps maximize the area of the extending part as seen in a top view of the N-type substrate SUB1 without interfering with the arrangement region of circuits (not shown in FIG. 8) other than the ESD protection circuit 14 and the protection target circuit 16. It is thus possible to give the through conductor 15 the lowest impedance without interfering with the arrangement region of circuits (not shown in FIG. 8) other than the ESD protection circuit 14 and the protection target circuit 16. Even in a case where the extending part is given an uneven width, in view of other points that have to be considered in designing, it is not always necessary to give the through conductor 15 the lowest impedance without interfering with the arrangement region of circuits (not shown in FIG. 8) other than the ESD protection circuit 14 and the protection target circuit 16.

3. Applications

Figure 9:
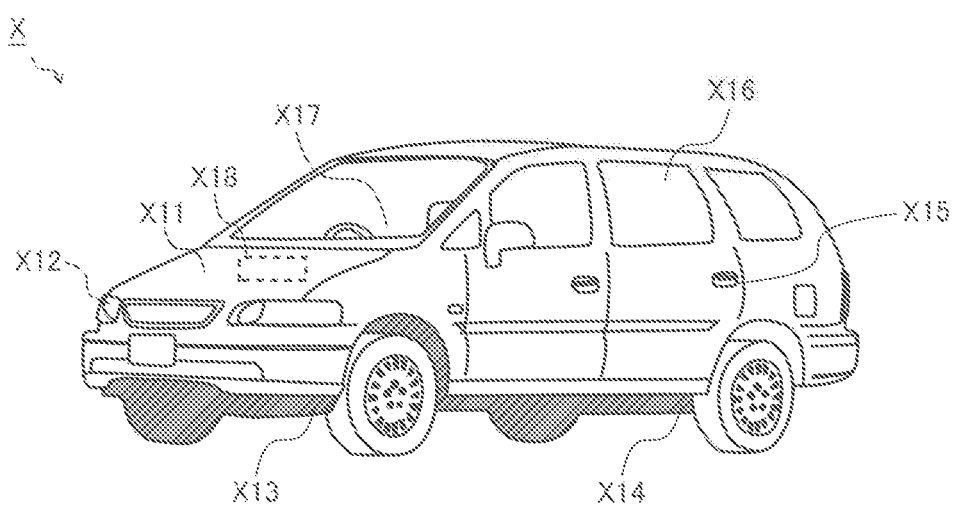
FIG. 9 is an exterior view of a vehicle.

FIG. 9 is an exterior view showing one configuration example of a vehicle. The vehicle X of this configuration example incorporates a battery (unillustrated in FIG. 9) and various electronic appliances X11 to X18 that operate by being supplied with electric power from the battery. It should be noted that, for the sake of convenient illustration, the electronic appliances X11 to X18 may actually be arranged elsewhere than they are shown to be arranged in FIG. 9.

The electronic appliance X11 is an engine control unit that performs control with respect to the engine (such as the control of injection, electronic throttling, idling, an oxygen sensor heater, and automatic cruising).

The electronic appliance X12 is a lamp control unit that controls the turning on and off of HIDs (high intensity discharged lamps), DRLs (daytime running lamps), and the like.

The electronic appliance X13 is a transmission control unit which performs control related to transmission.

The electronic appliance X14 is a body control unit that performs control with respect to the movement of the vehicle X (such as the control of an ABS (anti-lock brake system), EPS (electric power steering), and electronic suspension).

The electronic appliance X15 is a security control unit which controls the driving of door locks, burglar alarms, and the like.

The electronic appliance X16 comprises electronic appliances incorporated in the vehicle X as standard or manufacturer-fitted equipment at the stage of factory shipment, such as wipers, power side mirrors, power windows, dampers (shock absorbers), a power sun roof, and power seats.

The electronic appliance X17 comprises electronic appliances fitted to the vehicle X optionally as user-fitted equipment, such as vehicle mounted AV (audio-visual) equipment, a car navigation system, and an ETC (electronic toll collection system).

The electronic appliance X18 are electronic appliances provided with a high-withstand-voltage motor such as a vehicle-mounted blower, an oil pump, a water pump, and a battery cooling fan.

The semiconductor device 100 described previously can be incorporated into any of the appliances X11 to X18.

4. Modifications

Although the embodiments described above deal with a vehicle-mounted high-side switch IC as an example, this is not meant to limit the application of the invention disclosed herein. The present invention can be widely applied to, for example, not only vehicle-mounted IPDs (such as vehicle-mounted low-side switch ICs and vehicle-mounted power supply ICs) intended for other uses but semiconductor integrated circuit devices provided with ESD protection circuits in general.

The various technical features disclosed herein may be implemented in any other manner than in the embodiments described above, and allow for many modifications without departing from the spirit of the present invention. That is, the embodiments descried above should be understood to be in every aspect illustrative and not restrictive. The technical scope of the present invention is defined not by the description of the embodiments given above but by the appended claims, and should be understood to encompass any modifications made in the sense and scope equivalent to those of the claims.

5. Overview

According to one aspect of what is disclosed herein, a semiconductor device includes: an N-type substrate; a through conductor penetrating the N-type substrate; a protection target circuit provided on the N-type substrate; and an ESD protection circuit provided on the N-type substrate. Here, the protection target circuit and the ESD protection circuit are connected together to the through conductor. (A first configuration.)

In the semiconductor device according to the first configuration described above, the through conductor can have an extending part extending along an outer edge of the ESD protection circuit as seen in a top view of the N-type substrate. (A second configuration.)

In the semiconductor device according to the second configuration described above, the extending part can be ring-shaped and surround the ESD protection circuit as seen in a top view of the N-type substrate. (A third configuration.)

In the semiconductor device according to the second or third configuration described above, the extending part can have an uneven width. (A fourth configuration.)

In the semiconductor device according to any of the first to fourth configurations described above, as seen in a top view of the N-type substrate, a first-direction end part of the protection target circuit can be located to a first-direction side of a first-direction end part of the ESD protection circuit, a second-direction end part of the protection target circuit can be located to a second-direction side of a second-direction end part of the ESD protection circuit, and the first and second directions can be opposite to each other. (A fifth configuration.)

In the semiconductor device according to any of the first to fifth configurations described above, the ESD protection circuit can include: a clamper configured to generate a clamp voltage when a voltage applied to the through conductor exceeds a threshold voltage; and a vertical field-effect transistor configured to be on when the clamper is generating the clamp voltage. (A sixth configuration.)

The semiconductor device according to any of the first to sixth configurations described above can further include: a gate control circuit configured to generate a gate voltage; and an N-channel high-side switch configured to switch between conducting and cut-off states the path between a power supply and a load in accordance with the gate voltage. (A seventh configuration.)

According to another aspect of what is disclosed herein, an electronic appliance includes: the semiconductor device according to any of the first to seventh configurations described above. (An eighth configuration.)

According to yet another aspect of what is disclosed herein, a vehicle includes: a battery; and the electronic appliance according to the eighth configuration described above configured to operate by being supplied with a supply voltage from the battery. (A tenth configuration.)

What is claimed is:

1. A semiconductor device comprising:
    an N-type substrate;
    a through conductor penetrating the N-type substrate;
    a protection target circuit provided on the N-type substrate; and
    an ESD protection circuit provided on the N-type substrate,
    wherein:
        the protection target circuit and the ESD protection circuit are connected together, and the protection target circuit and the ESD protection circuit are connected to the through conductor, and
        the ESD protection circuit includes:
            a clamper configured to generate a clamp voltage when a voltage applied to the through conductor exceeds a threshold voltage; and
            a vertical field-effect transistor configured to be on when the clamper is generating the clamp voltage.

2. The semiconductor device according to claim 1, wherein
    the through conductor has an extending part extending along an outer edge of the ESD protection circuit as seen in a top view of the N-type substrate.

3. The semiconductor device according to claim 2, wherein the extending part is ring-shaped and surrounds the ESD protection circuit as seen in a top view of the N-type substrate.

4. The semiconductor device according to claim 2, wherein
the extending part has an uneven width.

5. The semiconductor device according to claim 1, wherein
as seen in a top view of the N-type substrate,
a first-direction end part of the protection target circuit is located to a first-direction side of a first-direction end part of the ESD protection circuit,
a second-direction end part of the protection target circuit is located to a second-direction side of a second-direction end part of the ESD protection circuit, and
the first and second directions are opposite to each other.

6. The semiconductor device according to claim 1, further comprising:
a gate control circuit configured to generate a gate voltage; and
an N-channel high-side switch configured to switch between conducting and cut-off states a path between a power supply and a load in accordance with the gate voltage.

7. An electronic appliance device comprising:
the semiconductor device according to claim 1.

8. An electronic appliance device comprising:
the semiconductor device according to claim 6.

9. A vehicle comprising:
a battery; and
the electronic appliance according to claim 7 configured to operate by being supplied with a supply voltage from the battery.

10. A vehicle device comprising:
a battery; and
the electronic appliance according to claim 8 configured to operate by being supplied with a supply voltage from the battery.

* * * * *